United States Patent
Briand et al.

(10) Patent No.: US 10,399,487 B2
(45) Date of Patent: Sep. 3, 2019

(54) LIGHTING SYSTEM FOR MOTOR VEHICLE PASSENGER COMPARTMENT

(71) Applicant: VALEO VISION, Bobigny (FR)

(72) Inventors: Gilles Briand, Mougins (FR); Pierre Albou, Paris (FR)

(73) Assignee: VALEO VISION, Bobigny (FR)

( * ) Notice: Subject to any disclaimer, the term of this patent is extended or adjusted under 35 U.S.C. 154(b) by 94 days.

(21) Appl. No.: 15/441,757

(22) Filed: Feb. 24, 2017

(65) Prior Publication Data
US 2017/0240106 A1    Aug. 24, 2017

(30) Foreign Application Priority Data

Feb. 24, 2016   (FR) ..................... 16 51523

(51) Int. Cl.

| | |
|---|---|
| *B60Q 3/74* | (2017.01) |
| *B60Q 3/80* | (2017.01) |
| *F21V 5/04* | (2006.01) |
| *F21V 9/08* | (2018.01) |
| *F21V 23/00* | (2015.01) |
| *H01L 27/15* | (2006.01) |
| *H01L 33/18* | (2010.01) |
| *H01L 33/32* | (2010.01) |

(Continued)

(52) U.S. Cl.
CPC .............. *B60Q 3/74* (2017.02); *B60Q 3/745* (2017.02); *B60Q 3/80* (2017.02); *F21V 5/04* (2013.01); *F21V 9/08* (2013.01); *F21V 23/005* (2013.01); *H01L 27/156* (2013.01); *H01L 33/18* (2013.01); *F21Y 2105/12* (2016.08); *F21Y 2115/10* (2016.08); *H01L 33/32* (2013.01)

(58) Field of Classification Search
CPC .. B60Q 3/74; B60Q 3/80; B60Q 3/745; F21S 41/141; F21V 5/04; F21V 9/08; F21V 23/005; H01L 27/156; H01L 33/18; H01L 33/32; F21Y 2105/12; F21Y 2115/10
See application file for complete search history.

(56) References Cited

U.S. PATENT DOCUMENTS

| | | |
|---|---|---|
| 6,331,063 B1 | 12/2001 | Kamada et al. |
| 2002/0006040 A1 | 1/2002 | Kamada et al. |

(Continued)

FOREIGN PATENT DOCUMENTS

| | | |
|---|---|---|
| EP | 0 921 568 B1 | 8/2010 |
| EP | 2 923 891 A2 | 9/2015 |

(Continued)

OTHER PUBLICATIONS

French Preliminary Search Report dated Oct. 14, 2016 in Patent Application No. FR 1651523 (with English translation of categories of cited documents).

*Primary Examiner* — Mary Ellen Bowman
(74) *Attorney, Agent, or Firm* — Oblon, McClelland, Maier & Neustadt, L.L.P.

(57) ABSTRACT

A motor vehicle passenger compartment lighting system includes semiconductor light-emitting light sources and a substrate on which the light sources are grown. The light sources define a plurality of light-emitting zones (Sa, Slg, Sld), and the system is configured to activate the light source or sources of the same zone independently from one zone to another. The plurality of zones (Sa, Slg, Sld) are configured to emit beams intended to produce different lighting effects from one zone to another.

14 Claims, 1 Drawing Sheet

Figure 1:
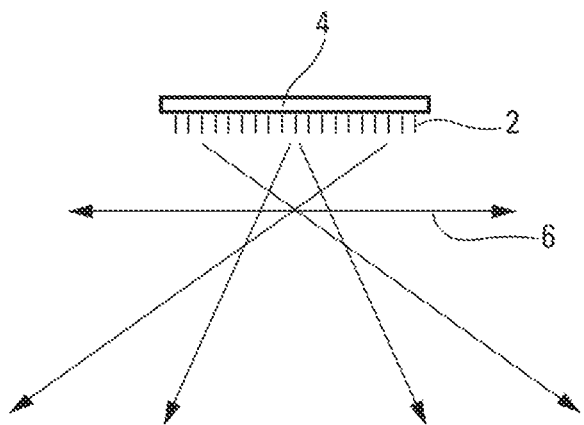

(51) Int. Cl.
 *F21Y 105/12* (2016.01)
 *F21Y 115/10* (2016.01)

(56) References Cited

U.S. PATENT DOCUMENTS

| | | |
|---|---|---|
| 2003/0133307 A1 | 7/2003 | Sugihara et al. |
| 2003/0174499 A1* | 9/2003 | Bohlander ......... H05B 33/0812 362/240 |
| 2006/0146553 A1 | 7/2006 | Zeng et al. |
| 2007/0091634 A1 | 4/2007 | Sakurada |
| 2011/0058379 A1* | 3/2011 | Diamantidis ........ C09K 11/025 362/296.01 |
| 2011/0204327 A1* | 8/2011 | Hiruma ................. H01L 27/153 257/13 |
| 2011/0254034 A1 | 10/2011 | Konsek et al. |
| 2011/0279039 A1* | 11/2011 | Kishimoto ......... H05B 33/0803 315/113 |
| 2014/0239327 A1 | 8/2014 | Konsek et al. |
| 2015/0233551 A1* | 8/2015 | Cho .................... H01L 25/0753 29/840 |
| 2015/0243853 A1 | 8/2015 | Cha et al. |
| 2015/0274070 A1 | 10/2015 | Shiraishi et al. |
| 2015/0298607 A1 | 10/2015 | Salter et al. |

FOREIGN PATENT DOCUMENTS

| | | |
|---|---|---|
| FR | 3 011 388 A1 | 4/2015 |
| GB | 2473311 A | 3/2011 |
| WO | WO 2006/042050 A2 | 4/2006 |
| WO | WO 2010/014032 A1 | 2/2010 |
| WO | WO 2013/102996 A1 | 7/2013 |

* cited by examiner

LIGHTING SYSTEM FOR MOTOR VEHICLE PASSENGER COMPARTMENT

The present invention concerns a lighting system for the passenger compartment of a motor vehicle.

In this field, it has long been known to provide the passenger compartment of a motor vehicle with ambient lighting or lighting for reading. The lighting is generally provided by separate modules dedicated to each of these functions.

It is known to provide reading lights with mobile lenses making it possible to direct the light beam into different locations of the vehicle, or even to change the size of the lit area. This avoids having to increase their number. However, the use of moving parts makes these modules somewhat complex. Reading lights have already been proposed formed of a light guide with different portions that are lit as a function of the area that it is wished to light. However, they necessitate a separate light source for each area. Moreover, these various solutions provide only the reading light function with the result that one or more additional modules must be employed to provide the ambient lighting function.

Also known are modules combining different incandescent or halogen lamps offering both ambient lighting and reading lights, possibly in different directions. However, these modules employ numerous lamps to provide the various lighting functions required and as a result offer a limited level of integration. The quality of the lighting produced also remains low.

An objective of the invention is to alleviate at least partly the drawbacks referred to above and to this end the invention proposes a lighting system for a motor vehicle passenger compartment including semiconductor light-emitting light sources and at least one substrate on which said light sources are grown, said light sources being arranged on said substrate to define a plurality of light-emitting zones, said system being configured to activate the light source or sources of the same zone independently from one zone to another, said plurality of zones being configured to emit beams intended to produce different lighting effects from one zone to another.

Thanks to the invention, a high degree of integration is obtained. In fact, light sources grown on only one substrate are used to provide the various lighting functions required, such as ambient lighting and/or reading lights.

A result of this kind is moreover obtained without having recourse to moving parts. In fact, the possible size of the substrate makes it possible to install light sources making it possible to light areas that are far apart.

The use of semiconductor light-emitting sources moreover makes it possible to provide new lighting effects compared to the incandescent and/or halogen lamps of known modules.

There follow additional features of the invention, which may be considered separately or in combination:
- the system is configured to supply power to the light source or sources of the same zone independently of another of said zones,
- the system is configured so that the light source or sources of at least one zone are selectively supplied with power by at least two different electric currents,
- said light sources are light-emitting diodes disposed on said substrate,
- said light-emitting diodes are submillimeter size light-emitting rods extending from said substrate,
- the light-emitting diodes, in particular said rods, have a different configuration from one zone to another,
- said substrate is a layer of material, notably of Si,
- the at least one of said zones includes a wavelength converter,
- said system includes a control unit configured to control, in particular selectively, the supply of power to said zones,
- said control unit is configured to supply said zones with power by a current differing from one zone to another,
- said control unit is configured to supply the same one of said zones with power by different currents,
- at least part of the control unit is stacked under the substrate so as to connect said control unit electrically to said substrate,
- said control unit includes a printed circuit card,
- said card is disposed on a face of said substrate opposite a face carrying said light sources,
- said control unit is configured to supply power to some or all of said zones so as to obtain ambient lighting,
- said control unit is configured to supply power to at least one of the zones so as to obtain lighting for reading,
- said control unit is configured to supply power to at least one of the zones so as to obtain ambient lighting and at least one other zone so as to obtain lighting for reading,
- said control unit is configured to supply power to a first of said zones intended to light a first region and to supply power to at least a second of said zones intended to light at least one second region adjacent the second,
- said control unit is configured to supply power, at the choice of a user, to only the first of said zones or the first and the second of said zones so as to increase at will the size of the region lit by the reading light,
- the second zone surrounds the first zone,
- said first and second zones are concentric,
- said system further includes sources configured to emit rays having a wavelength in a non-visible, in particular infrared and/or ultraviolet, range,
- said sources configured to emit rays having a wavelength in a non-visible range are disposed on said substrate,
- said light sources configured to emit rays having a wavelength in a non-visible range include light-emitting rods provided with at least one wavelength converter,
- said rods of the light sources configured to emit rays having a wavelength in a non-visible range are grown from said substrate,
- said system further includes a unit for tracking the occupants of the vehicle configured to exploit information gathered with the aid of the rays emitted by said source or sources emitting rays having a wavelength in the non-visible range,
- said system further includes a shaping optic,
- said shaping optic includes one or more focused lenses to generate a narrow aperture beam and/or one or more wide angle lenses,
- said shaping optic is directly in contact with said light sources, in particular with a distal end of said rods.

Figure 2:
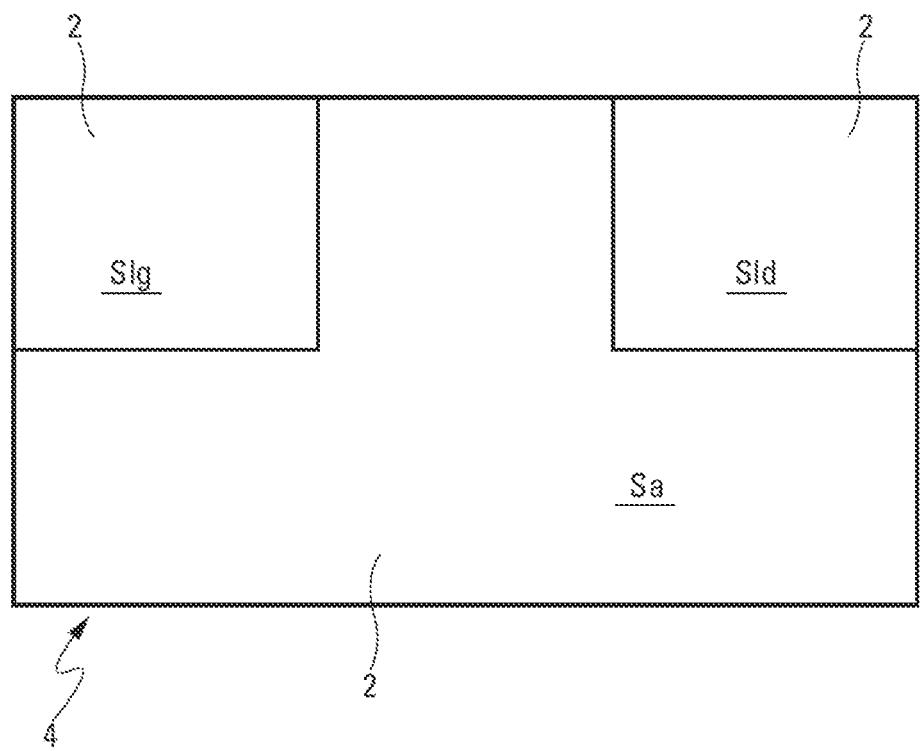

Other advantages and features of the invention will appear on reading the following description given by way of nonlimiting example only and with reference to the appended drawings, in which:

FIG. 1 is a diagrammatic side view of the lighting system according to one embodiment of the invention, FIG. 2 is a diagrammatic front view of the light-emitting zones of a lighting system according to one embodiment of the invention.

As shown in FIG. 1, the invention concerns a lighting system for motor vehicle passenger compartments. It is advantageously configured to be integrated into a vehicle passenger compartment interior trim element such as a ceiling liner, a multifunction windscreen module, etc.

Said system includes semiconductor light-emitting light sources 2 and a substrate 4 on which said light sources 2 are grown. For example, said light sources 2 are light-emitting diodes disposed on said substrate 4. In particular, these light-emitting diodes are configured in the form of submillimeter size light-emitting rods, each rod 2 being symbolized here by a line. Said rods extend from said substrate 4 which can be a layer of material, notably of Si.

Said rods 2 have a concentric layer structure, notably layers of GaN with quantum wells between them, said layers being grown on said substrate 4. The nature and the disposition of the layers make possible the emission of photons all along the rods.

Said substrate 4 and said rods 2 are formed by one or more dies. For example, in known dies utilizing a technology of this kind said rods 4 have a diameter of less than one micron and a height of approximately 2.5 microns and are spaced from one another on the substrate 4 by a distance of the order of 10 to 50 microns. Said dies are notably of rectangular shape and the dimensions of their sides are of the order of one centimeter.

As shown in FIG. 2, said light sources are distributed over said substrate to define a plurality of light-emitting zones Sa, Slg, Sld. Moreover, said system is configured to activate the light source or sources of the same zone independently from one zone to another, said plurality of zones Sa, Slg, Sld being configured to emit beams intended to produce different lighting effects from one zone to another. For example, said system can provide general and/or local lighting in the passenger compartment of the vehicle, at the front, at the rear and/or for each passenger. This may notably be ambient lighting, lighting for reading and/or lighting of specific points or components of the vehicle, such as the glovebox, door opening and/or controls.

Here said system includes a substantially rectangular light-emitting surface divided into three light-emitting zones Sa, Slg, Sld in the sense of the invention. Two of said light-emitting zones Slg, Sld are intended to form reading lights. In the figure, they are respectively situated in the top left and top right corners. The substantially inverted T-shaped remainder of the emitting surface defines the third emitting zone. It is intended to produce ambient lighting. Of course, a configuration of this kind is not limiting on the invention, either in terms of the shape of the surface or of the emitting zones, the number of emitting zones, the relative positioning of said emitting zones, the nature of the lighting effect to be provided by each of said emitting zones, or in terms of any other parameter provided that at least two of said emitting zones are able to provide lighting effects of a different type from one zone to another.

As a result the invention makes it possible to provide the various lighting functions required with a high degree of integration and without having recourse to moving parts.

To this end, according to a first variant, said light sources 2, in particular said rods, have a different configuration from one zone to another. For example, said rods can be implanted on the substrate 4 with a different density from one zone to another.

For example, the rod density can be lower in the zone or zones Sa intended to provide ambient lighting and higher in the zone or zones Slg, Sld intended to provide lighting for reading. This is symbolically represented in the figure where the density of points in the zone Sa is lower than the density of points in the zones Slg and Sld. One example of the density for a zone intended to provide lighting for reading can correspond to a distance of approximately 30 microns between rods, for example.

This being the case, each of said zones can be formed of one or more dies placed side by side to attain the required configuration, said dies preferably being identical, at least zone by zone. Alternatively, the same die can be used to define a plurality of emitting zones by conferring on the system the possibility of activating each of the zones of the die selectively to obtain lighting effects that are differentiated from one zone to another.

Said system can further include one or more wavelength converters for changing the color emitted by said light sources, at least for some of the zones, notably zones lighting components of the vehicle. In other words, at least one of said zones can include a wavelength converter. By wavelength converter is meant a light converter including at least one luminescent material designed to absorb at least part of at least one excitation light emitted by a light source and to convert at least a part of said excitation light it has absorbed into emitted light having a wavelength different from that of the excitation light. For example, to emit white light, rods will be used emitting blue light or UV with a light converter to produce the white light by additive synthesis.

Where the activation of said zones Sa, Slg, Sld is concerned, said system is for example configured to supply power to the light source or sources of the same zone independently of another of said zones. Inside each zone, the die or dies of the same zone are supplied with power in parallel. If the same die includes a plurality of emitting zones, then each zone of the die is supplied with power separately.

Said system is advantageously configured so that the light source or sources of at least the same zone are selectively supplied with power by at least two different electric currents. According to this mode of operation, a variant embodiment of the invention is available that can be substituted for or combined with the first variant described above, on the basis of the density of the rods.

For example, said system includes a control unit, not shown, configured to control selectively the supply of power to said zones, or even the level of the output current to supply power to each of the zones. In other words, said control unit control unit can be configured to supply power to said zones or not according to activation instructions it has received. Said control unit can advantageously be further configured to supply the same one of said zones with different levels of current. Different lighting effects can therefore be obtained for the same zone, or a zone can even be given a lighting function identical to that of another zone, notably an adjacent zone, for example to increase the size of the emitting surface dedicated to a given lighting function. For example, by limiting their power supply current, the surfaces Sld and Slg can be used for diffuse ambient lighting to complement the ambient lighting provided by the zone Sa instead of being used for lighting for reading.

In other words, said control unit is configured:
- to supply power to some or all of said zones so as to produce ambient lighting, and/or
- to supply power to at least one of the zones so as to produce lighting for reading and/or
- to supply power to at least one of the zones to produce ambient lighting and at least one other zone to produce lighting for reading.

Said control unit notably includes a printed circuit card. Said card can be disposed on a face of said substrate opposite a face carrying said light sources 2. In other words, at least a part of the control unit, here said printed circuit card, is stacked under the substrate so as to connect said control unit electrically to said substrate. For example, said printed circuit card is notably a printed circuit card of the PCB ("Printed Circuit Board") type and/or a flexible printed circuit card, notably of the FPCB ("Flexible Printed Circuit Board") type, and/or a variable geometry interconnection device, notably of the MID ("Molded In Device") type. The fixing of the control unit is fixed to said substrate via the electrical connections. The latter may be effected by soldering or by gluing, notably using a conductive, for example silver-based, glue.

Said system can further include a heat dissipator, said card being situated between said substrate and said dissipator.

Referring again to FIG. 1, it is seen that said system can further include a shaping optic 6. For example, said optic 6 is intended to reduce the divergence of the beam emitted by the zone or zones providing the lighting for reading function or even the function of lighting precise areas such as a tray for odds and ends and/or a door opening. It can also be intended, additionally or alternatively, to diffuse the beam emitted by the zone or zones providing the ambient lighting function. To this end it includes one or more optical components.

For example, said shaping optic includes one or more lenses of a first type configured to control the divergence of the beam for the ambient lighting function so that light is not lost to the outside of the cone to be lit, for example to avoid losing light through the side window. It can further include one or more lenses of a second type, notably wide angle lenses, intended to widen the emitted beam to reach a part of the passenger compartment to be lit. It can further include for the reading light function optical elements with a reduced projection field such as one or more focused lenses for generating a narrow aperture beam, notably with an aperture of less than 45°.

Each of the lenses can be associated with one and/or the other of said emitting zones.

Said shaping optic, in particular said lens or lenses, is preferably directly in contact with said light sources over a part or the whole of said emitting zone or zones, in particular with a distal end of said rods.

According to one aspect of the invention, said system further includes sources configured to emit rays having a wavelength in a non-visible, in particular infrared or ultraviolet, range.

For example, said sources configured to emit rays having a wavelength in a non-visible range are disposed on said substrate. These are notably light-emitting rods, for example grown on the substrate, provided with a wavelength converter.

The system can further include a unit for tracking the occupants of the vehicle configured to exploit information gathered with the aid of the rays emitted by said source or sources emitting rays having a wavelength in the non-visible range. Said control unit is configured to supply power to said zone or zones as a function of information, notably information gathered by said unit for tracking the occupants of the vehicle, for example the presence of the occupants in the zone to be lit.

The invention claimed is:

1. A lighting system for a motor vehicle passenger compartment comprising:

a controller;
semiconductor light-emitting light sources; and
at least one substrate on which the light sources are grown, the light sources being arranged on the at least one substrate to define a plurality of light-emitting zones on the at least one substrate, the controller being configured to activate a light source or sources of the same zone independently from one zone to another, said plurality of zones being configured to emit beams to produce different lighting effects from one zone to another, wherein
the density of positions of the light sources on the at least one substrate is different between different zones, and a light source is spaced from another light source in each zone by a distance in the range between 30 µm and 50 µm,
the controller being configured to supply power to a light source or sources of the same zone independently of another of the zones, and
at least part of the controller is stacked under the at least one substrate to connect the controller electrically to at least one substrate.

2. The lighting system according to claim 1, wherein the light sources include submillimeter size light-emitting rods extending from the at least one substrate.

3. The lighting system according to Claim 1, wherein the zones include at least one wavelength converter.

4. The lighting system according to claim 1, the controller being configured so that a light source or sources of at least one zone are selectively supplied with power by at least two different electric currents.

5. The lighting system according to claim 3, wherein the controller includes a printed circuit card.

6. The lighting system according to claim 5, wherein the card is disposed on a face of the at least one substrate opposite a face carrying the light sources.

7. The lighting system according to claim 1, further comprising light sources configured to emit rays having a wavelength in a non-visible range.

8. The lighting system according to claim 7, wherein the light sources configured to emit rays having a wavelength in a non-visible range are disposed on the at least one substrate.

9. The lighting system according to claim 8, wherein the light sources configured to emit rays having a wavelength in a non-visible range include light-emitting rods provided with at least one wavelength converter.

10. The lighting system according to claim 9, wherein the rods of the light sources configured to emit rays having a wavelength in a non-visible range are grown on the at least one substrate.

11. The lighting system according to claim 1, further comprising a shaping optic.

12. The lighting system according to claim 11, wherein the shaping optic includes one or more focusing lenses to generate a narrow aperture beam and/or one or more wide angle lenses.

13. The lighting system according to claim 12, wherein the shaping optic is directly in contact with the light sources.

14. The lighting system according to claim 12, wherein the controller is configured to supply the same power to all the light sources of the same zone.

* * * * *